(12) United States Patent
Ishibashi et al.

(10) Patent No.: US 8,036,254 B2
(45) Date of Patent: Oct. 11, 2011

(54) SEMICONDUCTOR LASER DRIVING CIRCUIT, AND OPTICAL DISC DEVICE AND INTEGRATED CIRCUIT PROVIDED WITH SEMICONDUCTOR LASER DRIVING CIRCUIT

(75) Inventors: Kenzo Ishibashi, Osaka (JP); Hisashi Senga, Osaka (JP); Takeharu Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 965 days.

(21) Appl. No.: 11/917,982

(22) PCT Filed: Jun. 14, 2006

(86) PCT No.: PCT/JP2006/311913
§ 371 (c)(1),
(2), (4) Date: Dec. 18, 2007

(87) PCT Pub. No.: WO2006/137303
PCT Pub. Date: Dec. 28, 2006

(65) Prior Publication Data
US 2010/0142336 A1    Jun. 10, 2010

(30) Foreign Application Priority Data

Jun. 20, 2005 (JP) .................................. 2005-178766

(51) Int. Cl.
*H01S 3/00* (2006.01)
(52) U.S. Cl. ............... 372/38.07; 372/38.02; 372/38.01; 372/38.1

(58) Field of Classification Search ............... 372/38.07, 372/38.02, 38.01, 38.1
See application file for complete search history.

(56) References Cited

U.S. PATENT DOCUMENTS

| 2002/0131358 | A1 | 9/2002 | Nagara |
| 2003/0035451 | A1* | 2/2003 | Ishida et al. ............... 372/38.02 |
| 2005/0117615 | A1 | 6/2005 | Fujiie et al. |
| 2009/0052492 | A1* | 2/2009 | Senga et al. ............. 372/50.121 |

FOREIGN PATENT DOCUMENTS

| JP | 5-75192 | 3/1993 |
| JP | 10-82806 | 3/1998 |
| JP | 11-307850 | 11/1999 |

(Continued)

OTHER PUBLICATIONS

International Search Report issued Sep. 12, 2006 in the International (PCT) Application No. PCT/JP2006/311913.

*Primary Examiner* — Kinam Park
(74) *Attorney, Agent, or Firm* — Wenderoth Lind & Ponack, L.L.P.

(57) ABSTRACT

The output voltage of a cathode drive-type semiconductor laser driving circuit is set to a minimum, power consumption by a driving circuit portion is suppressed, and the heat that is generated by the optical head or the optical disc device is reduced. In addition to a conventional configuration, the semiconductor laser driving circuit of the invention measures the cathode voltage (Vout) of a semiconductor laser (1) and controls the anode voltage (Vld) such that the cathode voltage (Vout) becomes a predetermined level, and by doing so sets the output voltage of the semiconductor laser driving circuit to a predetermined level in order to curtail power consumption by the driving circuit and minimize the rise in temperature of the optical head or the optical disc device.

12 Claims, 9 Drawing Sheets

FOREIGN PATENT DOCUMENTS

| | | |
|---|---|---|
| JP | 2000-244052 | 9/2000 |
| JP | 2002-76504 | 3/2002 |
| JP | 2002-158395 | 5/2002 |
| JP | 2002-260266 | 9/2002 |
| JP | 2003-152224 | 5/2003 |
| JP | 2003-332677 | 11/2003 |
| JP | 2006-85754 | 3/2006 |
| WO | 2004/110205 | 12/2004 |

* cited by examiner

SEMICONDUCTOR LASER DRIVING CIRCUIT, AND OPTICAL DISC DEVICE AND INTEGRATED CIRCUIT PROVIDED WITH SEMICONDUCTOR LASER DRIVING CIRCUIT

TECHNICAL FIELD

The present invention relates to semiconductor laser driving circuits that reduce the power consumption associated with the driving of a semiconductor laser, and to optical disc devices and integrated circuits provided with the same, and in particular, it relates to semiconductor laser driving circuits that are ideal for recording and reproducing data at high density and high speed to and from an optical disc using a blue semiconductor laser, and to optical disc devices and integrated circuits provided with the same.

BACKGROUND ART

In recent years, blue high-output semiconductor lasers have been developed, and high-density recording technology for optical discs that uses this short-wavelength laser light has been developed and adopted for practical use. In principal, blue semiconductor lasers have a larger forward voltage than do conventional red semiconductor lasers, and thus for a given forward voltage consume more power and produce more heat. For this reason, when a blue semiconductor laser is mounted to an optical head, there is a large rise in temperature due to the generation of heat, and thus the reduction of power in other blocks in the optical head and improvements in heat radiation have become important issues.

Conventionally, one method that has been used to reduce power consumption by the semiconductor laser driving circuit that is used in an optical disc device is the method of, in MD devices for music playback only, for example, to directly connect the semiconductor laser and the DC-DC converter to one another and then apply feedback based on the monitor results of the laser output of the semiconductor laser. With this method, the series voltage drop between the semiconductor laser and the DC-DC converter is a minimum, and moreover, in the DC-DC converter there is little voltage drop loss like in voltage regulators, and thus this method is ideal from the perspective of reducing power consumption. However, one issue with this method is that the response speed when switching from playback to record is not sufficient, and thus as it is, the method is not suited for recording devices.

The semiconductor laser driving circuit of Patent Document 1 is an example where the response speed is improved. Patent Document 1 discloses an "anode drive" type semiconductor laser driving circuit that performs control of the semiconductor laser by controlling the current that flows to the anode of the semiconductor laser, whose cathode is grounded. The forward voltage of the semiconductor laser (hereinafter, "Vop"; it should be noted that here this is equal to the anode voltage) varies by semiconductor laser and changes depending on the value of the forward current (If) of the semiconductor laser, and thus when Vop is equal to or less than a predetermined value, the voltage that is applied to the semiconductor laser driving circuit may be lowered by lowering the output voltage of the DC-DC converter, thereby suppressing unnecessary power consumption. In other words, if the Vop is equal to or less than a predetermined value, a semiconductor laser driving circuit that is low power and that switches between the record power and the playback power at high speed by switching the output voltage of the DC-DC converter to a low voltage that has been determined in advance is achieved.

Patent Document 2 discloses an anode drive-type semiconductor laser driving circuit whose aim is to reduce power consumption. In the semiconductor laser driving circuit of Patent Document 2, to accurately measure the circuit voltage, the output voltage of the DC-DC converter and the Vop are each measured through a level shift circuit and a peak hold circuit, and the difference between these two is calculated to measure the voltage that is applied to the semiconductor laser driving circuit, and the output voltage of the DC-DC converter is controlled based on this result.

Patent Document 3 discloses an anode drive-type semiconductor laser driving circuit. In the semiconductor laser driving circuit of Patent Document 3, the Vop of a blue semiconductor laser is measured through a peak hold circuit or an integrating circuit, for example, and the output voltage of the DC-DC converter is controlled so that a voltage that is equal to the voltage obtained by adding the voltage necessary for the semiconductor laser driving circuit to the Vop is output.

Patent Document 1: JP 2000-244052A
Patent Document 2: JP 2002-158395A
Patent Document 3: JP 2002-260266A

DISCLOSURE OF THE INVENTION (Problem to be Solved by the Invention)

The forward voltage of blue semiconductor lasers is in principle higher than that of red semiconductor lasers, and in practice, a voltage of about 4 to 6 V is required, and at the end of its life requires a voltage of 7 V. When an attempt is made to achieve this with a conventional anode drive-type semiconductor laser driving circuit such as those described in the background art, it is necessary to further increase the drive voltage by about 2 V, and as a result, the voltage that is needed by the semiconductor laser driving circuit becomes extremely high at about 9 V. However, the present withstand voltage is approximately 6 to 7 V in the primary semiconductor processing technology for manufacturing semiconductors that are used in the drive-type devices of consumer appliances such as optical disc devices. Considering that there are no foreseeable advances in semiconductor processing technology that will permit further miniaturization and higher withstand voltages, the integration of a circuit that operates at a voltage of 9 V or more is not practical.

Further, this is a drawback also in terms of reducing power consumption, which is a goal of the invention, because power consumption rises when the power source voltage rises.

Moreover, the anode drive-type semiconductor laser driving circuits of the conventional examples are not exactly favorable in terms of increasing speeds either. This is because it is necessary to use a p-type transistor (p-channel MOS FET or pnp-type bipolar transistor), which in general has slower operation than n-type transistors (n-channel MOS FETs or npn-type bipolar transistors), as the output transistor (MOS FET or bipolar transistor) of the semiconductor laser driving circuit. Even if it were possible to construct a semiconductor laser driving circuit with an n-type transistor, there is the problem that the drive voltage required for the semiconductor laser driving circuit would be about 2 V higher, and this would require an even higher voltage resistance by the semiconductor laser driving circuit and also would increase power consumption.

In light of the above, one might believe that, in order to drive a blue semiconductor laser at high speed and to integrate the semiconductor laser driving circuit (particularly the control portion) with a low-withstand voltage, inexpensive semiconductor process, it would be preferable to use a "cathode drive" type semiconductor laser driving circuit, in which a high voltage that is different from the voltage for operating the semiconductor laser driving circuit is applied to the anode of the blue semiconductor laser and the amount of current at the cathode of the semiconductor laser is controlled, rather than a conventional anode drive-type semiconductor laser driving circuit. The voltage of the cathode of the semiconductor laser during operation is a value that is less than the voltage of the anode by the amount of Vop, and thus the drive voltage of the semiconductor laser driving circuit itself can be set to 5 V or less, and for this reason, cathode drive-type semiconductor laser driving circuits are favorable for integration. Additionally, by adopting a cathode drive-type semiconductor laser driving circuit, the power used by the control portion of the semiconductor laser driving circuit can be reduced as well.

However, there are several issues that come to the fore when attempting to adopt a cathode drive-type semiconductor laser driving circuit in place of the anode drive-type semiconductor laser driving circuits discussed above. The semiconductor laser driving circuits of the three examples involve measurement of the forward voltage Vop of the semiconductor laser, but in cathode drive-type semiconductor laser driving circuits, the cathode of the semiconductor laser is not grounded and thus the Vop cannot be measured directly. Consequently, it is necessary to measure both the anode voltage and the cathode voltage of the semiconductor laser in order to calculate the Vop, and this complicates the circuit. Not only does the circuit become more complicated, but to directly measure the anode voltage of the blue semiconductor laser it is necessary to have a measurement circuit that has at least a withstand voltage of 7 V or more at the end of its life, and in practical terms this is a problem. Although it may be possible to lower the voltage and perform measurement using an external component, when this is integrated into an IC, the number of dedicated pins (terminals) on the IC will increase by one. Therefore, it has been thought that fundamental improvements and advances are essential before a cathode drive-type semiconductor laser driving circuit may be adopted for an anode drive-type semiconductor laser driving circuit.

The present invention is aimed at solving the above issue of achieving a reduction in power consumption in a cathode drive-type semiconductor laser driving circuit using a low withstand voltage circuit with a simple circuit configuration. By doing this, it is possible to suppress an increase in power consumption, as well as a rise in temperature due to the generation of heat, by the optical head and/or the optical disc device overall, and the life and the operation reliability of the semiconductor laser, for example, can be improved. By suppressing the power consumption of an optical head in which a blue semiconductor laser driving circuit has been incorporated, the advantage that high power is readily produced in high speed recording, for example, of an optical disc is retained, while it is possible to reduce the number of countermeasures such as heat radiation, and thus the device can be made smaller and less expensive.

Means For Solving Problem

In order to solve the foregoing conventional issues, a first aspect of the invention is a semiconductor laser driving circuit that is provided with a voltage source, a drive portion, a measurement portion, and a voltage control portion. The voltage source supplies an anode voltage to an anode of the semiconductor laser. The drive portion is connected to a cathode of the semiconductor laser and changes an amount of current that is drawn in from the semiconductor laser in accordance with the emission strength of the semiconductor laser, to control through feedback an optical output of the semiconductor laser. The measurement portion is connected to the cathode of the semiconductor laser and measures the cathode voltage. The voltage control portion is connected to the voltage source, and when the drive portion changes the amount of current that is drawn in according to the emission strength of the semiconductor laser to control through feedback the optical output of the semiconductor laser, it controls the anode voltage such that the cathode voltage is at least a first level that is a voltage level of at least a minimum voltage at which operation of the drive portion is guaranteed. And the anode voltage is equal to or greater than a withstand voltage of the drive portion and a withstand voltage of the measurement portion when the drive portion controls through feedback the optical output of the semiconductor laser.

With this semiconductor laser driving circuit, the voltage of the drive portion of the semiconductor laser, that is, the cathode voltage of the semiconductor laser, can be controlled to a predetermined level that is at or above a minimum level at which the drive portion can operate, and thus it is possible to suppress power consumption by the drive portion, and the production of heat and the rise in temperature of the semiconductor laser driving circuit overall can be prevented. It should be noted that "first level" refers to the voltage level of the minimum voltage at which operation of the drive portion is guaranteed.

A second aspect of the invention is the first aspect of the invention, in which the measurement portion includes a comparison portion for comparing the voltage value of the cathode voltage of the semiconductor laser or the voltage value after the cathode voltage has been voltage divided, and a voltage value of a third reference voltage.

Thus, if the resistors are disposed as independent components, it is possible to use a circuit with a low withstand voltage for the measurement portion. In particular, because the Vop of a blue semiconductor laser is high, this is effective for integrating the measurement portion into an IC in a low withstand voltage process.

A third aspect of the invention is the second aspect of the invention, in which the measurement portion further includes a memory portion that stores the result of a comparison with a bottom value of the cathode voltage at a pulse emission of the semiconductor laser, which is obtained by the comparison portion.

Thus, the minimum value of the cathode voltage of the semiconductor laser when the pulse is being modulated can be detected inexpensively, easily, and quickly.

A fourth aspect of the invention is the first aspect of the invention, in which some or all of the voltage source, the drive portion, the measurement portion, and the voltage control portion are provided as an integrated circuit.

Thus, it becomes possible to inexpensively and broadly deliver the benefit of the invention of reducing power consumption.

A fifth aspect of the invention is an optical disc device that is provided with a semiconductor laser driving circuit for recording and reproducing information of an optical disc and that has a voltage source, a drive portion, a measurement portion, and a voltage control portion. The voltage source supplies an anode voltage to an anode of a semiconductor laser. The drive portion is connected to a cathode of the semiconductor laser and draws in current from the semiconductor laser and changes the amount of current in accordance with the emission strength of the semiconductor laser to control through feedback an optical output of the semiconductor laser. The measurement portion measures a cathode voltage of the semiconductor laser. The voltage control portion is connected to the voltage source, and when the drive portion changes the current amount in accordance with the emission strength of the semiconductor laser to control through feedback the optical output of the semiconductor laser, it controls the anode voltage such that the cathode voltage is at least a first level that is a voltage level of at least a minimum voltage at which operation of the drive portion is guaranteed. And the anode voltage is equal to or greater than a withstand voltage of the drive portion and a withstand voltage of the measurement portion when the drive portion controls through feedback the optical output of the semiconductor laser.

It should be noted that the first level is the same as the first level in the first aspect of the invention.

With this optical disc device, it is possible to reduce as much as possible the power consumption by a semiconductor laser driving circuit for recording and reproducing information to and from an optical disc, and the generation of heat by the optical head and the optical disc device can be suppressed.

If the upper limit of the temperature of the semiconductor laser has been determined, then the temperature of the optical head itself can be kept from rising, and thus it is possible to achieve high-speed recording, which requires a high output power, a smaller and thinner drive device, and also it is possible to raise the allowable value of the temperature of the environment in which the optical disc device is used, and this has significant benefit.

A sixth aspect of the invention is the fifth aspect of the invention, in which the voltage control portion sets the anode voltage to a voltage level that is smaller than a second level when reproduction of optical disc information is stopped. It should be noted that the "second level" is for example the withstand voltage level of the circuit that makes up the drive portion.

Thus, it is possible to keep down the voltage of the output terminal of the semiconductor laser driving circuit, that is, the cathode voltage of the semiconductor laser, and it is possible to achieve a semiconductor laser driving circuit that is sufficiently reliable using generalized low-withstand voltage semiconductor processing technology.

A seventh aspect of the invention is the fifth or the sixth aspect of the invention, in which the voltage control portion raises the anode voltage to a voltage level that is higher than a third level prior to moving from a reproduction operation to a record operation, and lowers the anode voltage to the third level after the record operation is finished and operation is moved to the reproduction operation. It should be noted that the "third level" is for example the voltage level of the minimum cathode voltage that is required in order to secure the output power of the semiconductor laser during reproduction.

Thus, both output voltages of the semiconductor laser driving circuit in the optical disc device can be kept to minimum levels, and thus power reduction is achieved efficiently.

An eighth aspect of the invention is any one of the fifth through seventh aspects of the invention, in which the measurement portion is further provided with a comparison portion for comparing the voltage value of the cathode voltage of the semiconductor laser or the voltage value after voltage dividing the cathode voltage, and a voltage value of a fourth reference voltage, and a memory portion that stores the result of a comparison with a bottom value of the cathode voltage at pulse emission of the semiconductor laser that is obtained by the comparison portion. The measurement portion selectively measures the cathode voltage corresponding to a peak power of the semiconductor laser during the record operation. It should be noted that "selectively measures" means to selectively measure the lowest value among a plurality of local minimum values that appear during a fixed period of time, for example.

With this aspect of the invention, if during the record operation the semiconductor laser emits laser light that has been subjected to multi-pulse modulation, a cathode voltage that corresponds to the peak power of the semiconductor laser appears multiple times as a local minimum value, and thus it is possible to select the smallest cathode voltage from among those local minimums of the cathode voltage and measure it with the measurement portion. Consequently, the lowest value of the output voltage (cathode voltage) of the semiconductor laser driving circuit at peak power emission during recording can be accurately measured.

A ninth aspect of the invention is an integrated circuit for driving a semiconductor laser that is provided with a voltage source, a drive portion, and a measurement portion. The voltage source supplies an anode voltage to an anode of the semiconductor laser. The drive portion is connected to the cathode of the semiconductor laser and changes the amount of current that is drawn in from the semiconductor laser in accordance with the emission strength of the semiconductor laser to control through feedback an optical output of the semiconductor laser. The measurement portion is connected to the cathode of the semiconductor laser and measures a cathode voltage of the semiconductor laser.

A tenth aspect of the invention is the ninth aspect of the invention, further including a voltage control portion that, when the drive portion changes the amount of current that is drawn in accordance with the emission strength of the semiconductor laser to control through feedback the optical output of the semiconductor laser, controls the anode voltage of the semiconductor laser such that the cathode voltage is at least a first level that is a voltage level of at least a minimum voltage at which operation of the drive portion is guaranteed. And the anode voltage is equal to or greater than a withstand voltage of the drive portion and a withstand voltage of the measurement portion when the drive portion controls through feedback the optical output of the semiconductor laser.

It should be noted that the first level is the same as the first level in the first aspect of the invention.

With this integrated circuit, it is possible to create a semiconductor laser driving circuit in which power consumption is suppressed without using a externally-added circuit.

An eleventh aspect of the invention is an integrated circuit for driving a semiconductor laser that is provided with a drive portion and a measurement portion. The drive portion is connected to a cathode of the semiconductor laser and changes the amount of current that is drawn in from the semiconductor laser in accordance with the emission strength of the semiconductor laser to control through feedback an optical output of the semiconductor laser. The measurement portion is connected to the cathode of the semiconductor laser and measures a cathode voltage of the semiconductor laser.

A twelfth aspect of the invention is the eleventh aspect of the invention, further including a voltage control portion that, when the drive portion changes the amount of current that is drawn in accordance with the emission strength of the semiconductor laser to control through feedback the optical output of the semiconductor laser, controls the anode voltage of the semiconductor laser such that the cathode voltage is at least a first level that is a voltage level of at least a minimum voltage at which operation of the drive portion is guaranteed. And the anode voltage is equal to or greater than a withstand voltage of the drive portion and a withstand voltage of the measurement portion when the drive portion controls through feedback the optical output of the semiconductor laser.

The first level is the same as the first level in the first aspect of the invention.

With the integrated circuits of the eleventh and twelfth aspects of the invention, a voltage source is not included, and thus it is possible to attain integrated circuits that are less likely to be affected by power noise from the voltage source, for example. Further, because the integrated circuits do not include a voltage source, they can be achieved with generalized low-withstand voltage semiconductor processing technology.

Effects Of The Invention

With the cathode drive-type semiconductor laser driving circuit of the invention, the configuration is such that only the output voltage (cathode voltage of the semiconductor laser) is measured and the anode voltage of the semiconductor laser is controlled, and as a result it is possible to provide an inexpensive semiconductor laser driving circuit in which there is less power consumption and heat generated from that power consumption, and which has superb reliability, as well as optical disc devices and integrated circuits provided with that semiconductor laser driving circuit.

Figure 1:
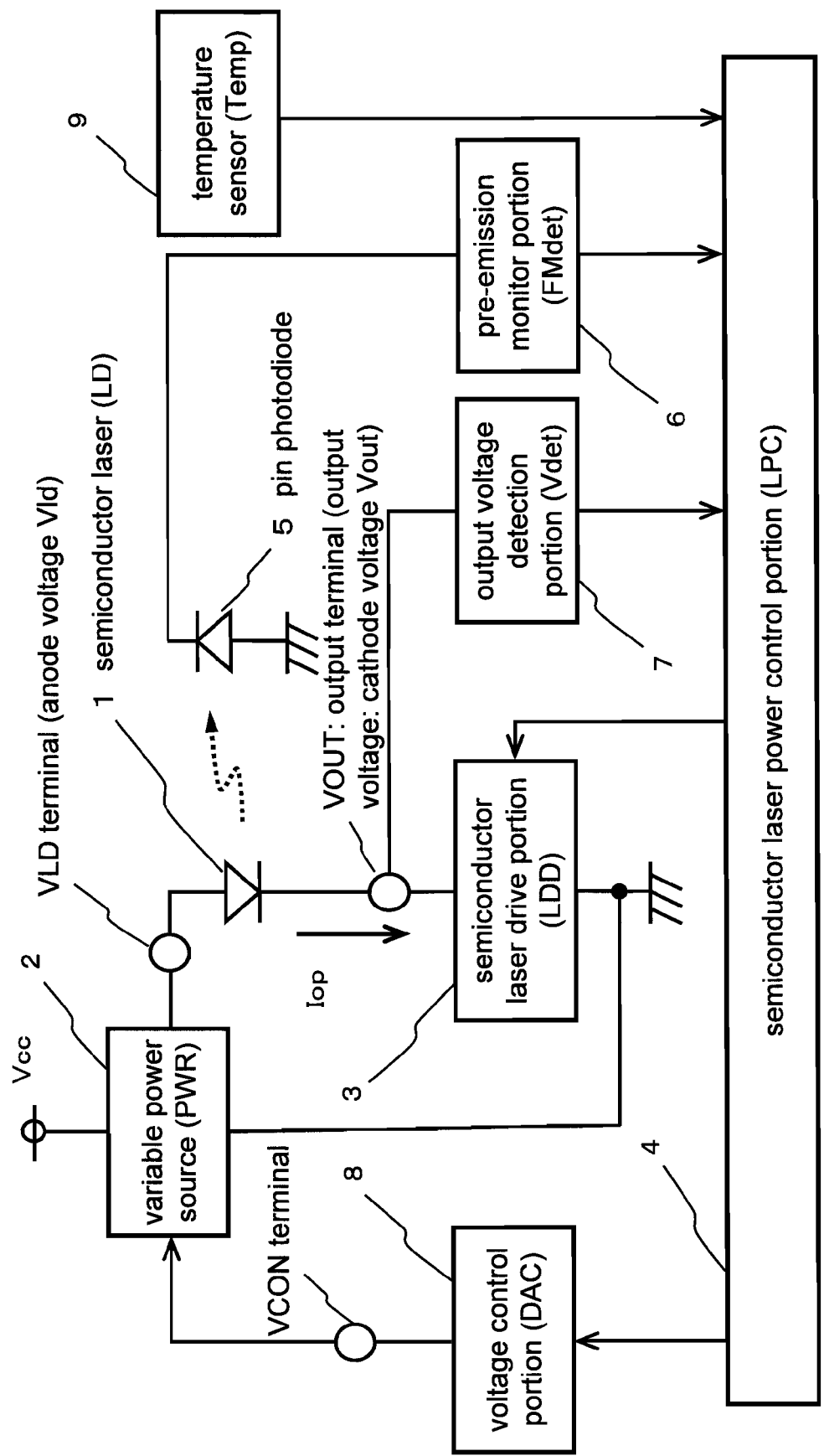
FIG. 1 is a block diagram of the semiconductor laser driving circuit of an embodiment of the invention.

DESCRIPTION OF THE REFERENCE NUMERALS 1 semiconductor laser (LD)
2 variable voltage source (PWR)
3 semiconductor laser drive portion (LDD)
4 semiconductor laser power control portion (LPC)
5 pin photodiode
6 pre-emission monitor portion (FMdet)
7 output voltage detection portion (Vdet)
8 voltage control portion (DAC)
9 temperature sensor (Temp)
Vld anode voltage
Vout cathode voltage (output voltage)
RDDAC reproduction current source
BSDAC bias current source
PKDAC peak current source
Q31,Q32 transistor
71,72 cathode voltage Vout dividing resistor
73 comparator
74 reference voltage source
75,76 NAND gate
81 current source
82,82G transistor
83,83G resistor
84,84G switch
100 optical disc device
2a voltage regulator
R1,R2 anode voltage Vld dividing resistor
2b voltage boosting DC-DC converter
R3,R4 Vld control resistor

BEST MODE FOR CARRYING OUT THE INVENTION

Figure 9:
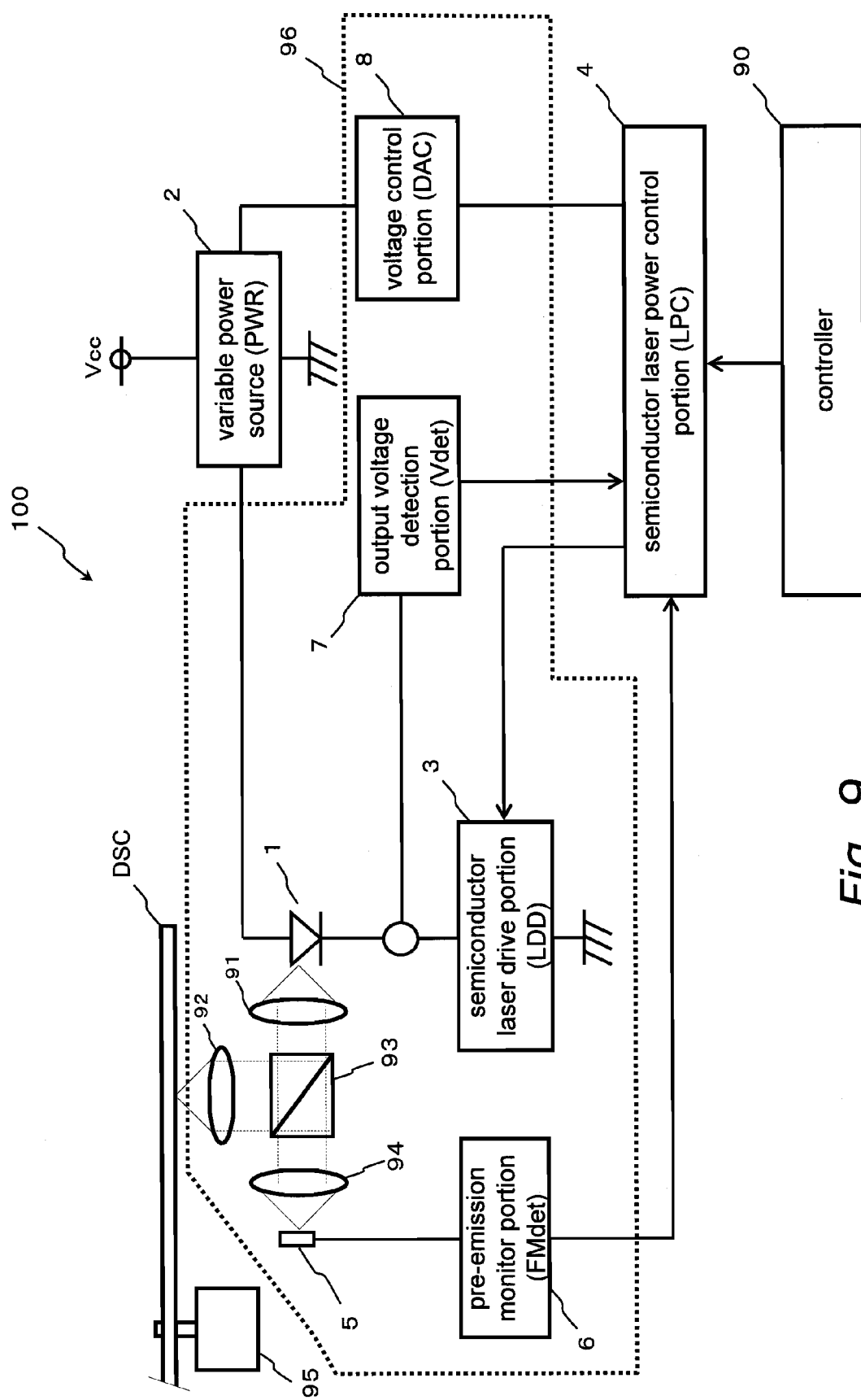
FIG. 9 is a block diagram of the optical disc device.

Below, an embodiment of the invention is described in reference to the drawings. The semiconductor laser driving circuit described below is, for example, as shown in FIG. 9, installed in a recording and reproduction type, or a reproduction only type, optical disc device 100. It should be noted that FIG. 9 shows only the main sections of the optical disc device 100. The record operation and the reproduction operation of the optical disc drive are briefly described using FIG. 9. When information is recorded or reproduced, laser light is emitted from a semiconductor laser 1 at a strength that corresponds to either recording or reproduction, and that laser light is converted into parallel light by a collimator lens 91. Most of the laser light that has been converted to parallel light is reflected by a polarized beam splitter 93 and is guided toward and passes through an objective lens 92 and is then irradiated onto a region of an optical disc DSC to either record or reproduce information. On the other hand, a little bit of laser light that is converted to parallel light by the collimator lens 91 is transmitted by the polarized beam splitter 93, condensed by a condensing lens 94, and received by a pin photodiode 5, and the intensity of the laser light during recording or reproduction is detected.

The semiconductor laser driving circuit is described below. It should be noted that unless noted otherwise, the following explanation is made under the assumption that the output voltage is equal to the cathode voltage of the semiconductor laser.

FIG. 1 is a block diagram of the semiconductor laser driving circuit in an embodiment of the invention.

In FIG. 1, reference numeral 1 denotes a semiconductor laser, and 2 denotes a variable voltage source for supplying voltage to the anode of the semiconductor laser 1, and the variable voltage source 2 receives the voltage supplied from the power source voltage Vcc and outputs an anode voltage Vld to a VLD terminal. The cathode of the semiconductor laser 1 emits light due to a semiconductor laser drive portion 3 sucking in current from the output terminal VOUT (the semiconductor laser drive portion 3 controls the amount of current that flows to the cathode of the semiconductor laser 1). The light intensity of the semiconductor laser 1 is controlled by a semiconductor laser power control portion 4 by a sink current Iop. In a specific example of the optical disc device, at the time of playback, a current that has been modulated by a high frequency module (not shown) that is provided in the semiconductor laser drive portion is allowed to flow as the sink current Iop, and the playback power level of the semiconductor laser 1 is obtained. At the time of recording, a current that has been pulse modulated in correspondence with the shape of the recording marks and spaces flows as the sink current Iop, and the recording power level of the semiconductor laser 1 is obtained. The playback power level and the recording power level of the semiconductor laser are controlled through feedback by sampling the test emission and the pulse waveform.

As for detecting the light intensity of the semiconductor laser 1, the light that is emitted by the semiconductor laser 1 is received by a pin photodiode 5, and a current that corresponds to the intensity of the light from the semiconductor laser 1 flows to the pin photodiode 5, and thus that current is subjected to current/voltage conversion by a pre-emission monitor portion 6 and sent to the semiconductor laser power control portion 4 as the light intensity (power) information. The voltage of the output terminal VOUT is detected as the cathode voltage Vout by an output voltage detection portion 7. In addition to ordinary control of the light intensity, the semiconductor laser power control portion 4 also controls the anode voltage Vld of the variable voltage source 2 through the VCON terminal of a voltage control portion 8 so that the voltage value of the cathode voltage Vout that is received from the output voltage detection portion 7 does not fall below a minimum operation voltage Vmin of the semiconductor laser drive portion 3. Ordinarily, it performs control so that the cathode voltage Vout is the same as Vmin in order to keep down power consumption by the semiconductor laser drive portion 3. Reference number 9 denotes a temperature sensor, and is used by the semiconductor laser power control portion 4 to reference against a table the value of the current resistance Rs and/or Vmin of the semiconductor laser 1, which change due to the temperature of the optical head.

Other than the variable voltage source 2 and the semiconductor laser power control portion 4, the structural elements of the above blocks are in principle provided in the optical head (which corresponds to the section identified by 96 in FIG. 9). For the variable voltage source, a generalized voltage regulator or DC-DC converter, for example, is favorable, and taking into consideration the installation space, power consumption, and noise, for example, preferably it is disposed outside the optical head. The functioning of the semiconductor laser power control portion 4 is achieved in part or entirely by controlling a microcomputer or DSP (digital signal processor) with software, and because the microprocessor or DSP is often integrated as a so-called optical disc device controller (for example, this corresponds to 90 in FIG. 9), the element that achieves the semiconductor laser power control portion 4 (a microcomputer, DSP, or controller integrating the same, that achieves some or all of the functioning thereof) is ordinarily disposed outside the optical head. It should be noted that while the voltage control portion 8 can be disposed outside the optical head, if it is incorporated as an IC or LSI along with the semiconductor laser drive portion 3 and the output voltage detection portion 7, then the reduction in power consumption of the present invention can be achieved without adding a new circuit to the semiconductor laser power control portion 4. That is to say, the voltage control portion 8, the semiconductor laser drive portion 3, and the output voltage detection portion 7 can be achieved by individually integrating them onto a single IC or LSI chip, or it is also possible for some or all of these to be integrated into a single IC or LSI chip. Communication with the blocks, other than the VCON terminal, can in principle be achieved by serial transfer, for example, and thus the effects of the invention can be attained simply by adding a VCON terminal and changing the control software.

Figure 7:
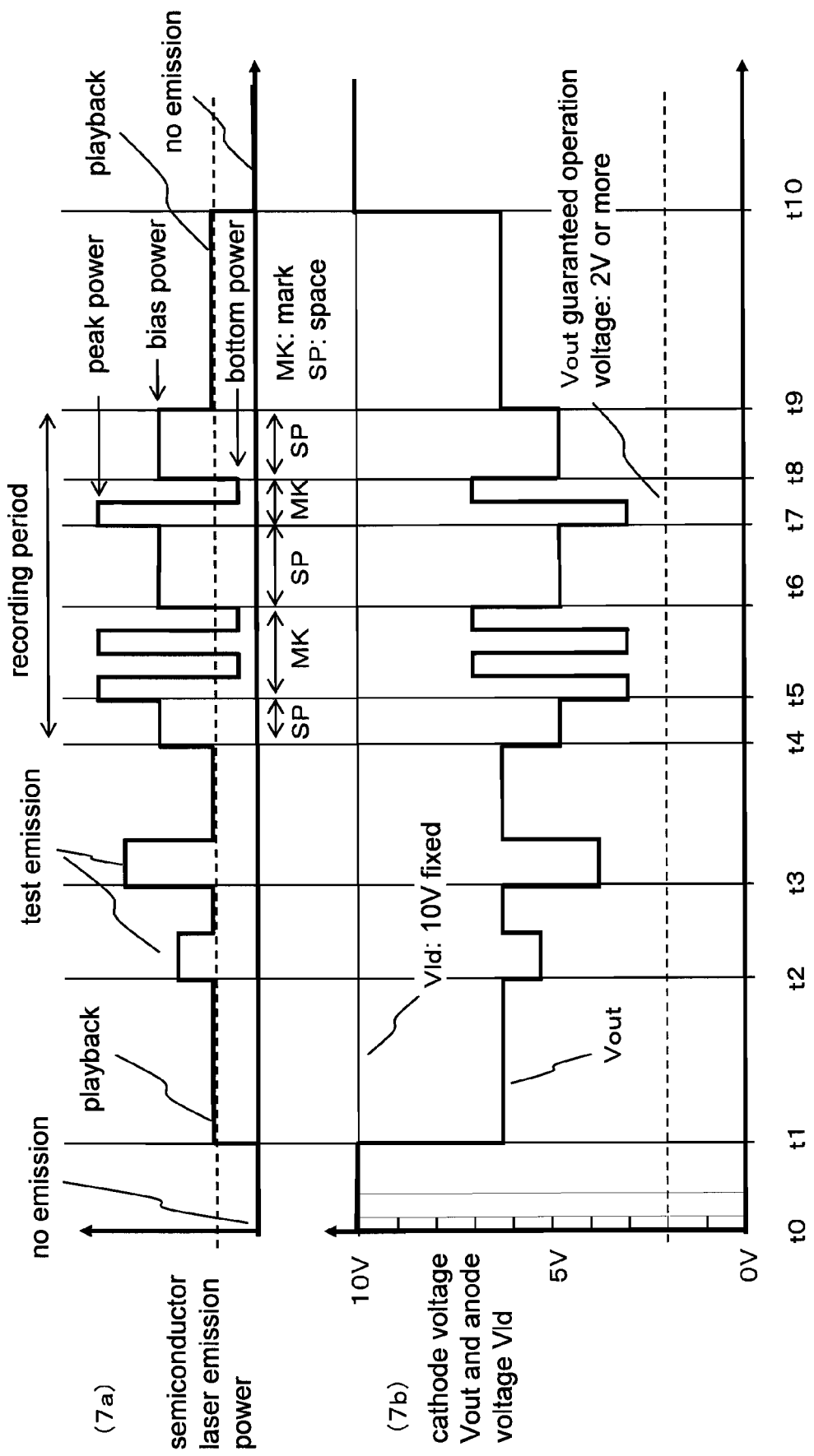
FIG. 7 is an operation timing diagram of the cathode voltage Vout during recording and reproduction (without voltage control).
Figure 8:
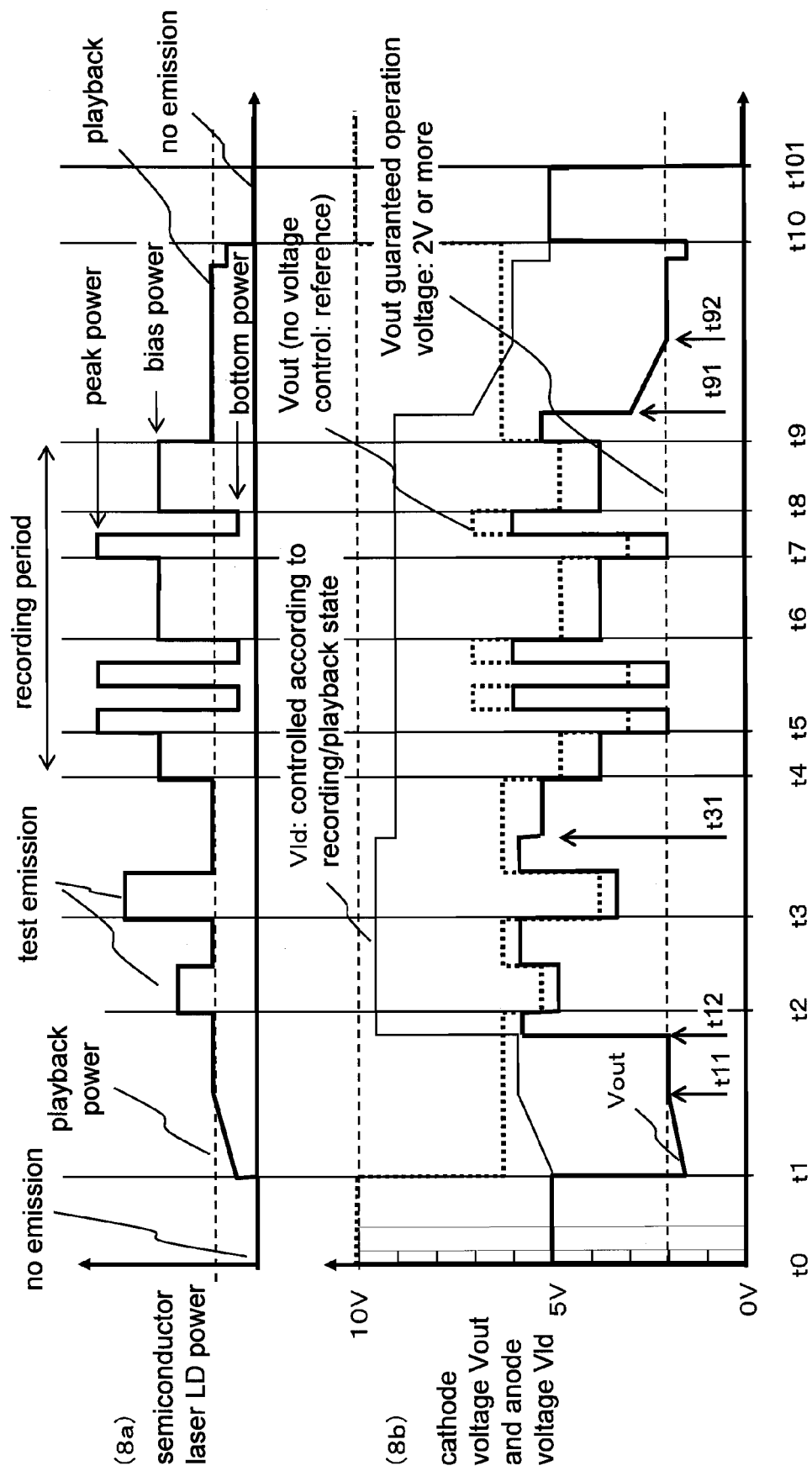
FIG. 8 is an operation timing diagram of the cathode voltage Vout during recording and reproduction (with voltage control).

The operation of the optical disc device whose structure is shown in the above block diagrams is described using FIGS. 7 and 8, but specific examples of its various components shall be described before this.

Figure 2:
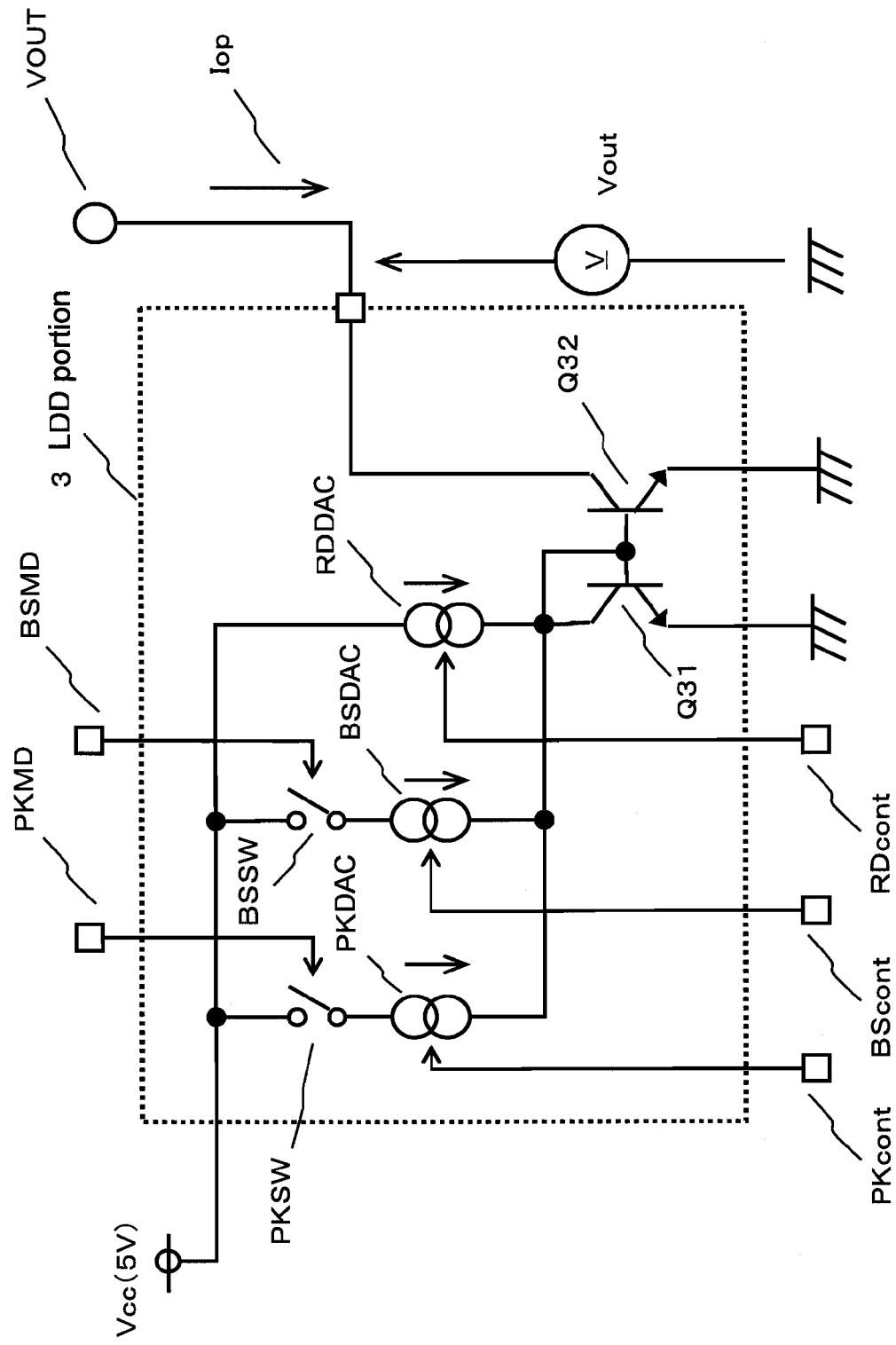
FIG. 2 is a diagram that shows a specific example of the semiconductor laser drive portion 3 (LDD) in the embodiment.

FIG. 2 is a specific example of the semiconductor laser drive portion 3. In this specific example, the presumption is for a recording/reproduction application of a phase change rewrite-type basic optical disc, for example, and is provided with current sources RDDAC, BSDAC, and PKDAC in order to produce a playback power, a bias power, and a peak power, respectively, in the output of the semiconductor laser 1. The amount of current of each current source RDDAC, BSDAC, and PKDAC is controlled by control signals that are input from the semiconductor laser power control portion 4 to the terminals RDcont, BScont, and PKcont, respectively. When recording to the optical disc, the current sources BSDAC and PKDAC are switched by switches BSSW and PKSW, respectively. Each current source is supplied with current from the power source voltage Vcc (5 V). Each current is added to the collector terminal of a transistor Q31. A current mirror circuit that is constituted by the transistor Q31 and a transistor Q32 supplies the summed current as the collector current of the transistor Q32, and this becomes the current that is drawn from the cathode of the semiconductor laser 1 via the output terminal VOUT as Iop. The current mirror circuit is designed such that the current ratio between the transistor Q31 and the transistor Q32 is for example approximately 1:50, in order to reduce current usage. The cathode voltage Vout is determined by subtracting the forward voltage Vop when the forward current is Iop from the anode voltage Vld of the semiconductor laser. Since the value of Iop is different during playback and during recording in the optical disc device, the cathode voltage Vout also is different when reproducing and when recording. When recording, particularly when PKSW and BSSW are in the on state, the cathode voltage is low. Vop is the product of the series resistance Rs of the semiconductor laser 1 and Iop, and the lower the temperature of the environment in which the semiconductor laser 1 is disposed, the larger the Rs and the forward voltage Vop, and thus the cathode voltage Vout becomes smaller. The anode voltage, which is output from the variable voltage source 2, is controlled in consideration of the above characteristics. It should be noted that the Iop and the Vop shown here are not the current and the voltage at the rated output of the semiconductor laser, but rather are the forward current that actually flows and the forward voltage that is determined due to that forward current.

Figure 3:
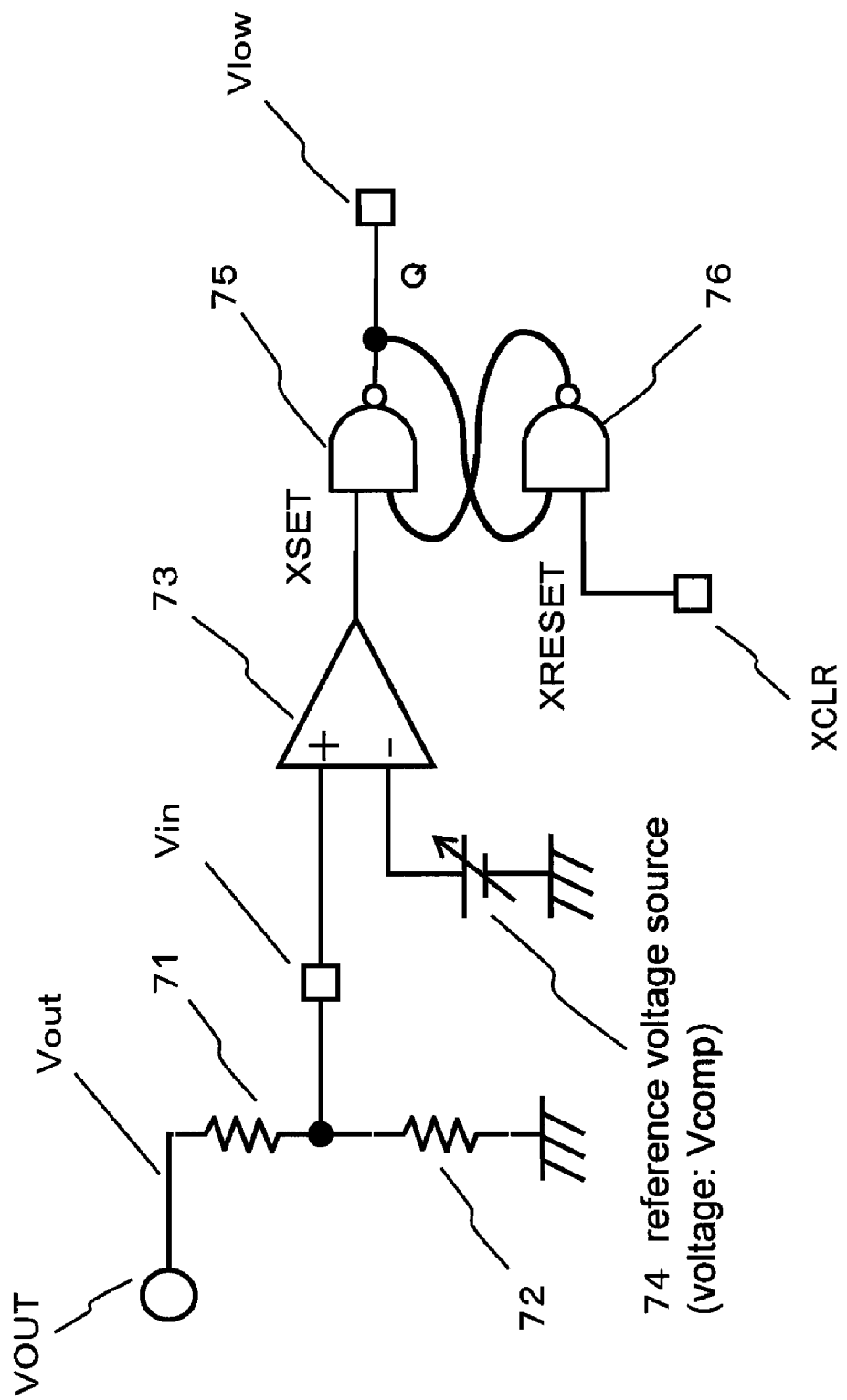
FIG. 3 is a diagram that shows a specific example of the output voltage detection portion 7 (Vdet) in the embodiment.

FIG. 3 is a specific example of the output voltage detection portion 7. It has a simple configuration, on the assumption that it will be integrated into the semiconductor laser drive portion 3. First, the cathode voltage Vout is divided by a resistor 71 and a resistor 72, and the voltage Vin is introduced. To keep down the current, the resistance is preferably high at about 1 to 10 kΩ. When the anode voltage Vld of the variable voltage source 2 is for example 8 V, then Vop=0 when the Iop of the semiconductor laser 1 is set to 0, and as a result a voltage of 8 V is applied to the Vin terminal, and thus resistance division is performed in order to prevent the IC, for example, from being destroyed if the output voltage detection portion 7 is integrated into an IC. By introducing the resistors 71 and 72 it is possible to easily prevent destruction of the IC, for example, even in the case of a control software bug or hardware failure. If the resistor 71 and the resistor 72 are given the same resistance, then the voltage dividing effect results in the voltage Vin becoming 4 V, which is half of the anode voltage Vld. Further, depending on the resistance, there will be some degree of flow of the forward current Iop to the semiconductor laser 1, and thus a forward voltage occurs in the semiconductor laser 1 and the cathode voltage Vout is sufficiently kept below the 4 V. To prioritize this voltage reducing effect, it is necessary to sacrifice some power consumption by the resistors and set the resistance to a low value.

In practice, protection of the IC is possible if the anode voltage Vld is set equal to 0 before light is emitted by the semiconductor laser 1, and the anode voltage can be reliably sequentially increased from 0 while increasing the amount of the current Iop that flows to the cathode of the semiconductor laser 1.

Vin is compared by a comparator 73 serving as the "comparison portion" against a variable-type reference voltage source 74 that has relatively few stages and is input to the XSET terminal of an RS flip-flop that serves as a "memory portion" that is made of, for example, NAND gates 75 and 76. The number of variable stages is reduced in order to make the IC low cost. An XCLR control signal that controls the on/off flip-flop operation of the RS flip-flop is input to an XRESET terminal of the RS flip-flop, and if that is set to "L" (low level for operating the logic circuit), then the result of the comparison is output directly to the Vlow terminal. When Vin is lower than Vcomp, Vlow is output as a true "H" (high level for operating the logic circuit). This detection assumes the case of playback by the optical disc device. Here, the minimum operating voltage Vmin of the semiconductor laser drive portion 3 is for example set to 1.5 V, and Vcomp is set to half of that at 0.75 V. First, when the semiconductor laser 1 is to emit light, if a high anode voltage Vld is set and a current that corresponds with the playback operation of the optical disc device is allowed to flow to the semiconductor laser 1, then Vlow becomes L. The anode voltage Vld is progressively lowered, and when Vlow becomes H, it can be determined that the operational limit of the semiconductor laser drive portion 3 has been reached. If the anode voltage of the semiconductor laser 1 is set to slightly in front of the operational limit of the semiconductor laser drive portion 3, then the cathode voltage Vout can be optimized for power reduction.

The latch function of the RS flip-flop is used to control detection during recording in the optical disc device. For example, a test emission of the semiconductor laser 1 is performed after setting the XCLR control signal to H. The test emission can be emission due to a multi pulse. If Vin falls below the voltage level of Vcomp even once and the XSET terminal becomes L, then Vlow becomes H. The voltage level of the cathode voltage Vout during recording can be sufficiently detected without using a circuit that is not suited for high speed, such as a bottom hold circuit (corresponds to the peak hold circuit of an anode drive-type semiconductor laser driving circuit), and measuring in real time. One simple detection method is to lower the anode voltage Vld during recording and then detect Vlow. It should be noted that to clear saved results, it is sufficient to temporarily set the XCLR control signal to L.

It should be noted that in a case where the semiconductor laser driving circuit is to be integrated, if measures for preventing a voltage equal to or greater than the withstand voltage of the integrated circuit from being applied to the VOUT terminal can be sufficiently achieved, then without specially providing a Vin terminal it is possible to directly measure the cathode voltage Vout internally within the IC, for example, and the number of pins (terminal number) of the IC, for example, can be set to one pin and two external resistors can be reduced. Particularly in a case where the aim is to achieve a miniature optical head, it can be expected that such actions to reduce the number of components, for example, will be necessary.

Figure 4:
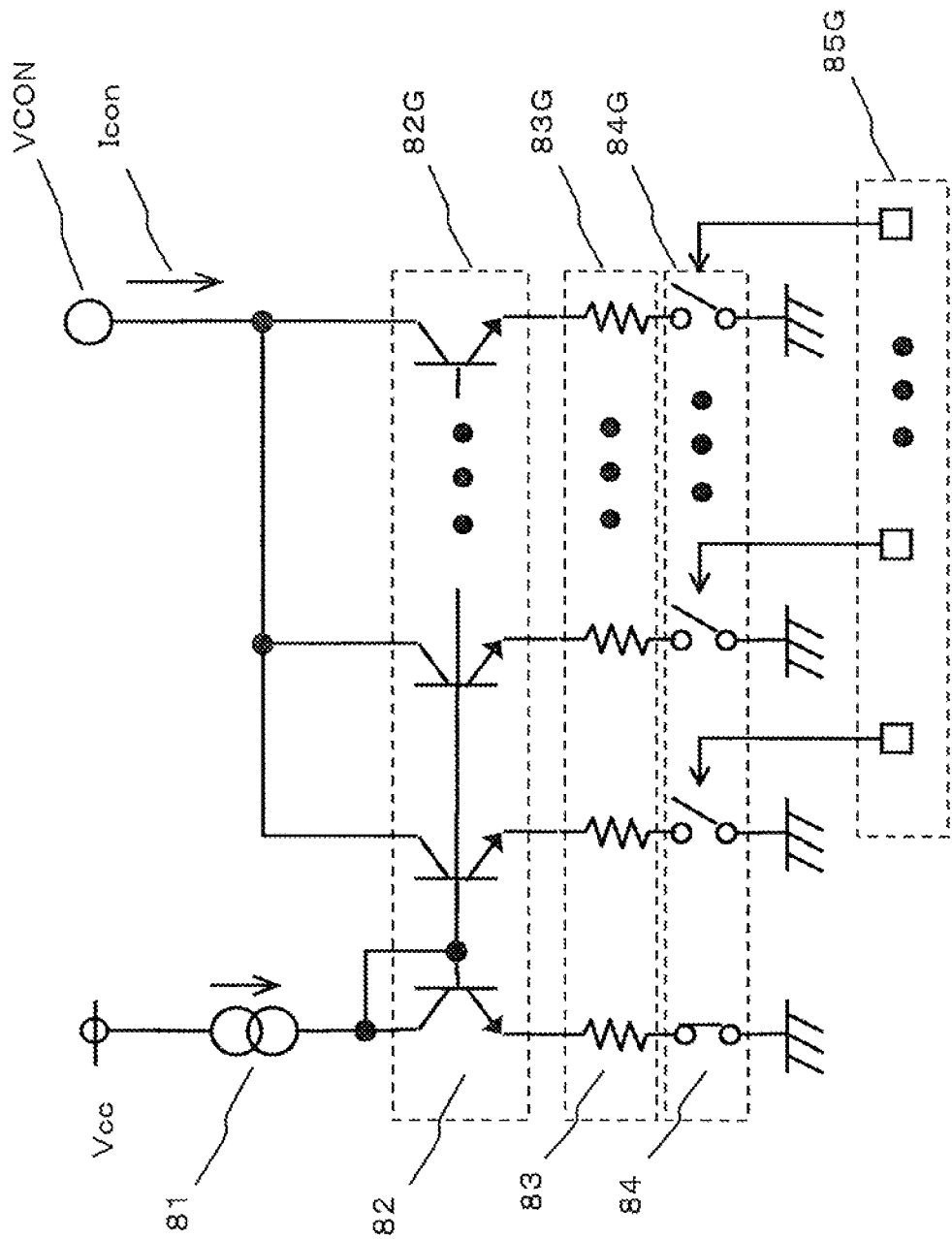
FIG. 4 is a diagram that shows a specific example of the voltage control portion 8 (DAC) in the embodiment.

FIG. 4 is a specific example of the voltage control portion 8. The voltage control portion 8 is a current draw (sink) type DA converter that is primarily made of transistors, resistors, and switches. Current flows from a reference current source 81 to a transistor 82, a resistor 83, and a switch 84, and a current mirror circuit that is weighted is formed by a transistor group 82G, a resistor group 83G, and a switch group 84G. The switch group 84G is turned on and off by a control signal group 85G, and draws in current of a desired current value. In other words, by turning the switch group 84G on and off with the control signal group 85G, it is possible to control the amount of current that flows to the VCON terminal. The voltage control portion 8 is connected to the variable voltage source 2 through the VCON terminal. A current source type DA converter is adopted for the voltage control portion 8 because this allows the noise resistance to be increased. Since the voltage control portion 8 and the variable voltage source 2, which is the controlled portion, are disposed within the actual optical disc device separated by a flexible printed circuit board or the like, the noise resistance drops when the voltage control portion 8 is achieved by a voltage control type device. Moreover, the variable voltage source 2 is often achieved by a voltage regulator or DC-DC converter, and when simply attempting to control the anode voltage of the semiconductor laser 1 with a voltage regulator or a DC-DC converter, it is favorable to use the sink-type current DA converter that is shown in this specific example as the voltage control portion 8.

Below, specific examples for controlling the anode voltage of the semiconductor laser 1 using a voltage regulator or a DC-DC converter are described using FIG. 5 and FIG. 6, respectively.

Figure 5:
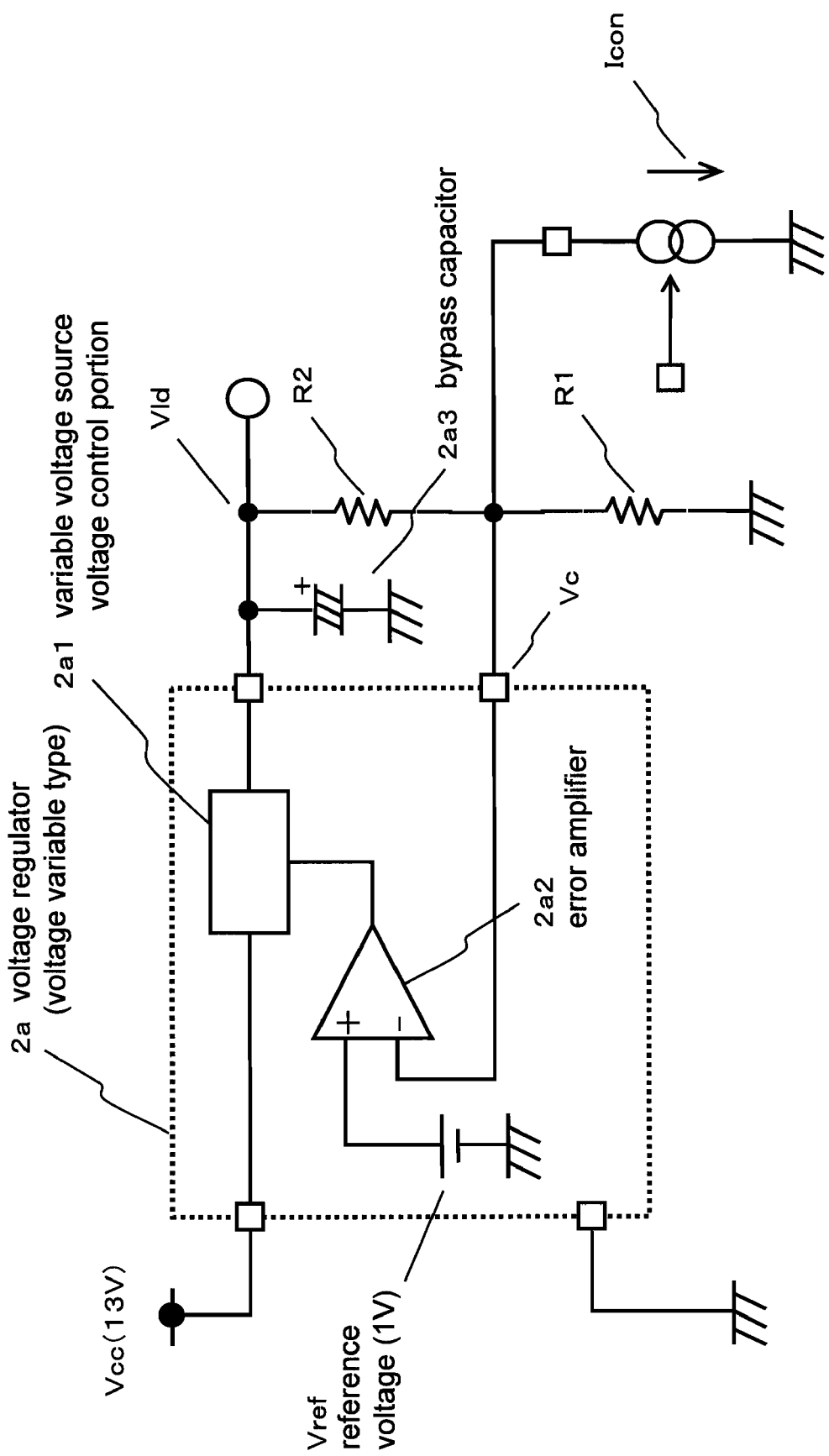
FIG. 5 is a diagram that shows a first specific example of the variable voltage source (PWR) in the embodiment.

FIG. 5 illustrates a first specific example of the variable voltage source 2. 2a denotes an output variable-type voltage regulator. A voltage source Vcc (such as 13 V) is received as input and an anode voltage Vld is output. 2a3 denotes a bypass capacitor for preventing oscillation of the output. The anode voltage Vld is split by a resistor R2 and a resistor R1, and the divided voltage Vc at the voltage division point is input to the voltage regulator 2a, the divided voltage Vc and the internal reference voltage (1 V) are compared by an error amplifier 2a2 and control through feedback is performed with a variable voltage source voltage control portion 2a1 so that Vc becomes 1 V, and the anode voltage Vld is output. Further, the current sink-type DA converter is connected to the voltage division point, and control is performed by the current sink-type DA converter such that the current indicated by Icon is allowed to flow. By doing this, the anode voltage Vld is controlled by the semiconductor laser power control portion 4. As one example of these calculations, the resistor R1 and the resistor R2 are set to 1 kΩ and 4 kΩ, respectively, and the DA converter has a 5 bit configuration whose current resolution is set to 50 μA. When the DA converter is controlled with 0 to 31 decimal notation, the anode voltage Vld can be varied between 5.00 V to 11.82 V (220 mV per step). In practical terms it is preferable for Vcc to be 12 V, and since the maximum value of Vop of the blue semiconductor laser is set to 6 to 7 V, the anode voltage Vld does not require a maximum level, and the listed level is considered practical.

The benefit of using a voltage regulator is that power source noise is reduced. Since the anode voltage Vld is applied directly to the semiconductor laser 1, there is no switching noise like in the case of a DC-DC converter, which will be discussed later, and this is advantageous. The power consumption of the voltage regulator itself is greater than a DC-DC converter, but the voltage regulator is disposed at a location that is separate from the optical head, and thus the generation of heat has little impact, and when it is desirable to reduce the effect of power source noise on the playback signal in a case where high speed playback is performed with the optical disc device, for example, a voltage regulator is an effective component.

Figure 6:
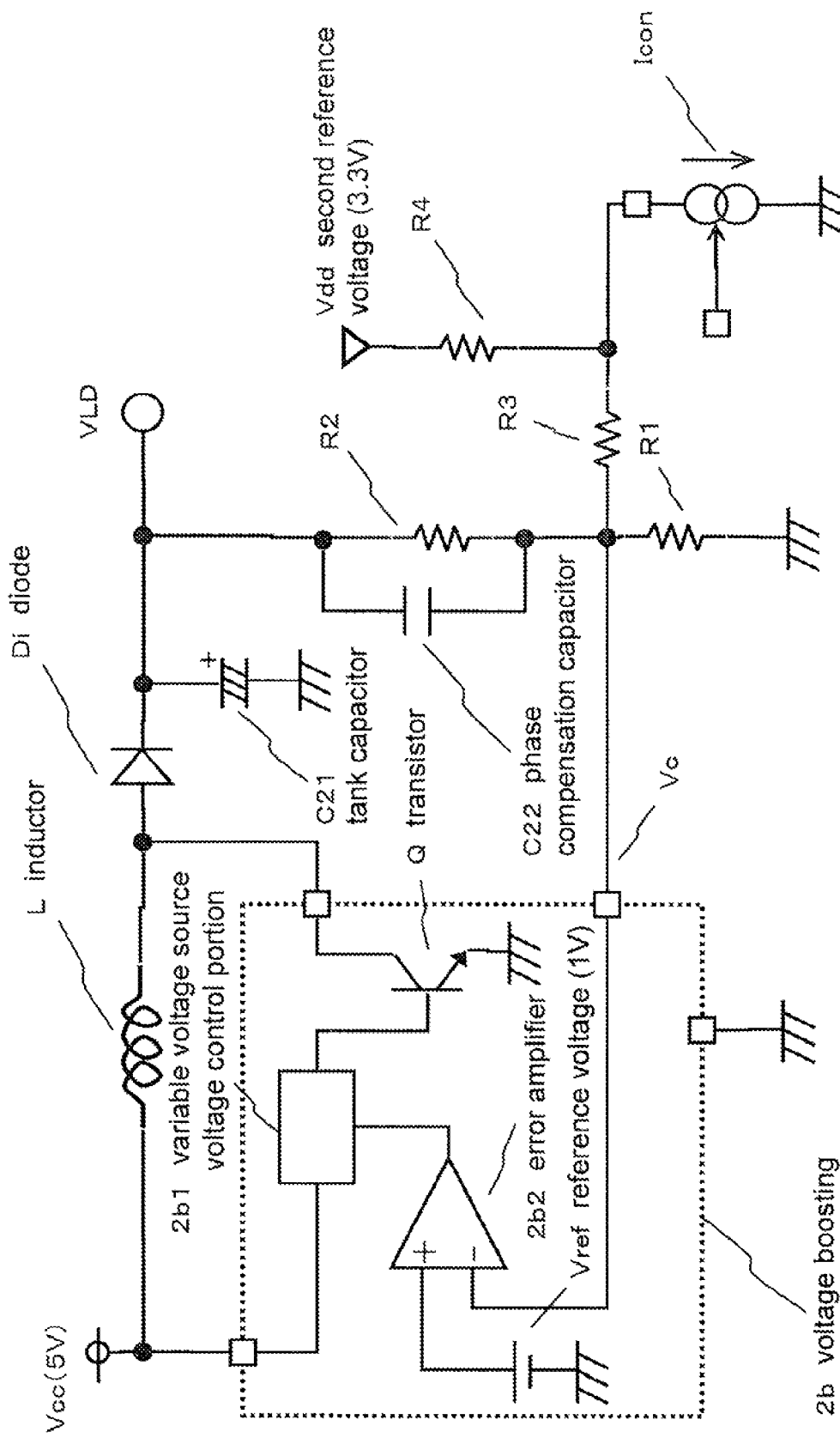
FIG. 6 is a diagram that shows a second specific example of the variable voltage source (PWR) in the embodiment.

FIG. 6 shows a second specific example of the variable voltage source 2. 2b denotes the control portion of a voltage boosting DC-DC converter that boosts the power source voltage Vcc (for example 5 V) to generate the anode voltage Vld. The overall principle of the operation is the same as general voltage boosting DC-DC converters. To explain briefly, voltage that is input to the voltage boosting DC-DC converter is boosted by controlling the current that flows to an inductor L through a switching operation of the transistor Q, and that voltage builds up in a tank capacitor C21 via the diode Di and the anode voltage Vld is generated. The anode voltage Vld is divided by a resistor R2 and a resistor R1, which are shown by the same notation as in the first specific example, and is input to an error amplifier 2b2 as Vc, a variable voltage power voltage control portion 2b1 switches the transistor Q so that Vc and the reference voltage Vref are the same, and finally feedback control is performed so that the anode voltage Vld becomes the target voltage. It should be noted that C22 is a phase compensation capacitor.

In general, DC-DC converters are used in low power applications, and thus to reduce outside power loss the recommendation values of the resistor R1 and the resistor R2 are large. In this example, R1=10 kΩ and R2=90 kΩ are the recommendation values. On the other hand, the voltage control portion 8 cannot change the output range based on an external variable voltage source if it is integrated into the semiconductor laser driving circuit. However, it is preferable that the resolution is the same as the range of the anode voltage Vld. To achieve this, a resistor R3 and a resistor R4 have been added. This allows the variable width and the step size of the anode voltage Vld to be controlled in the same way even if the same voltage control portion 8 as in the first specific example is used and the resistances of the resistors R1 and R2 are different. The specific formula is omitted because it can be readily calculated using Ohm's law, and only the results shall be shown. If the resistor R3 and the resistor R4 are set to 40 kΩ and 1.8 kΩ, respectively, then the anode voltage can be set to 5.05 V to 11.67 V (213 mV per step) in 0 to 31 steps at a current resolution of the DA converter at 50 µA. In this example, providing a resistor R4 as shown in FIG. 6 makes it possible to achieve a structure in which the current can be substantially sourced (supplied) to the voltage division point of the resistor R1 and the resistor R2 based on the amount of current, even if the voltage control portion 8 is a sink-type DA converter in which the current Icon flows only in a single direction only.

It should be noted that a voltage boosting DC-DC converter has higher power efficiency compared to the voltage regulator described above but tends to deteriorate the noise performance, and can be said to be suited for devices that require low power, such as video cameras that use a small diameter optical disc for recording and playback, and whose transfer rate during recording can be low. If a voltage boosting DC-DC converter is used as the variable voltage source 2, then, unlike a voltage regulator, the boosted voltage causes excess voltage to occur when there is damage or when a bug occurs and may destroy specific portions of the circuit, and thus it is preferable that protective means are installed.

A detailed description of the internal structure of the present invention has been described above, but the feature of the structure of the invention is that in a cathode drive-type semiconductor laser driving circuit the forward voltage Vop of the semiconductor laser is not measured directly using a complex circuit such as a differential application device, but rather that, with the simple means of measuring only the cathode voltage at a single point, which is the cathode drive output terminal, it is possible to set the voltage of the output stage of the semiconductor laser driving circuit to a value that is near to the voltage operation limit value, and it is possible to achieve a reduction in power consumption without sacrificing performance.

Hereinafter, a specific example of the control operation when the semiconductor laser driving circuit of the invention is installed in an optical disc device is described using the operation timing diagrams of FIG. 7 (when there is no voltage control for the anode voltage of the semiconductor laser 1) and FIG. 8 (when there is voltage control for the anode voltage of the semiconductor laser 1), comparing these to one another.

In 7a of FIG. 7, the vertical axis indicates the power level of the semiconductor laser 1 during each operation by the optical disc device, and the horizontal axis shows the time axis. 7b shows the voltage value of the cathode voltage Vout of the output terminal VOUT at this time. In the following description, the anode voltage Vld of the semiconductor laser 1 is fixed at 10 V and is not controlled, and the lower limit of the guaranteed operation voltage of the cathode voltage Vout of the semiconductor laser 1 is 2 V. Vld is set high at 10 V in order to secure sufficient cathode voltage Vout even when there is variation among semiconductor lasers 1 in their lifespan or environment.

First, time t0 to t1 is the time during which the semiconductor laser 1 is not emitting, and because the forward voltage of the semiconductor laser 1 is 0 V, the cathode voltage Vout is 10 V. In practice, a cathode voltage Vout of 10 V exceeds the withstand voltage of the output portion of the semiconductor laser driving circuit and is too high a voltage, and thus measures to keep this down are necessary, but here, for the sake of convenience it will be described as fixed at 10 V. At time t1, first the semiconductor laser drive portion 3 is controlled to cause the semiconductor laser 1 to emit light at the power during playback (playback power). Specifically, a current that corresponds to the playback power is allowed to flow to the current source RDDAC in FIG. 2. The Vop at this time is slightly low at 3.5 V. The cathode voltage Vout becomes 6.5 V, which is the value of a drop in voltage equal to Vop. The period from time t2 to t4 indicates the test emission period. First, at t2 a test emission at the bias power is performed, and then at t3 a test emission at the peak power is performed. The current that is obtained by adding the current due to the current source BSDAC to the current due to the current source RDDAC, and the current that is obtained by further adding the current due to the current source PKDAC, are allowed to flow as sink current Iop, respectively, via the current mirror circuit. The emission power of the semiconductor laser 1 is detected by the pre-emission monitor portion 6, and control is performed such that currents that correspond to the target bias power and peak power are delivered to the current source BSDAC and the current source PKDAC. At the same time, the current source RDDAC is adjusted so that it is possible to output the bottom power. The above computations and settings are carried out until time t4. In an actual optical disc drive, the high frequency module is activated only during playback and is not activated during recording, and thus the current source RDDAC requires correction, but this will not be described. In the recording periods from t4 to t9, which are the space formation periods indicated by SP in FIG. 7 (7a), the semiconductor laser 1 irradiates laser light at the bias power onto the optical disc. In the mark formation periods indicated by MK in FIG. 7 (7a), the semiconductor laser 1 irradiates laser light that has been multi-pulse modulated at the peak power and the bottom power onto the optical disc. During the recording periods, the cathode voltage Vout falls inversely proportional to the emission power of the semiconductor laser 1. More correctly, a voltage drop in an amount of the product of the series resistance Rs and the forward current Iop of the semiconductor laser 1 occurs. FIGS. 7 and 8 show examples of the above operation. Then, at time t9, the semiconductor laser 1 returns to the playback state and stops emitting light at time t10.

To properly control the power of the semiconductor laser 1 in the above operating state, it is sufficient for the cathode voltage Vout to be 2 V or more as mentioned above, and in FIG. 7 this is at least 3 V, which sufficiently satisfies this condition. Conversely, during non-emitting periods or during playback, the cathode voltage Vout becomes higher than necessary, and this causes an increase in power consumption of the semiconductor laser drive portion 3. In the output stage only, the consumed power is simply the product of Iop and Vout. It is the aim of the invention to secure the necessary cathode voltage Vout for operation while minimizing an increase in power consumption by the semiconductor laser drive portion 3, and next this operation is described.

FIG. 8 shows the operation of controlling the anode voltage Vld with the semiconductor laser power control portion 4 of the invention as the same operation of the optical disc device as in FIG. 7. For the voltage control portion 8, the voltage regulator, which is the first specific example shown in FIG. 5, is used. When the semiconductor laser 1 is not emitting light from time t0 to t1, the value of Icon is 0, and the anode voltage Vld is becomes 5 V. At time t1 the semiconductor laser 1 emits light, and at the time of this emission the anode voltage Vld remains at 5 V. As a result, the cathode voltage Vout falls below 2 V. The cathode voltage Vout is then progressively increased while it is compared with 2 V by the output voltage detection portion 7. When it goes over 2 V, the anode voltage Vld is fixed (time t11). It should be noted that with the value that has been set for the anode voltage Vld at t1, it is unclear whether or not playback power servo is possible, that is, whether or not it is possible to execute playback APC (Auto Power Control), and thus, in order to stabilize the operation, a conceivably favorable control procedure is to set it to a setting that allows a "threshold current" to flow to the semiconductor laser 1 and then raise up the anode voltage Vld until the cathode voltage Vout exceeds 2 V, and then carry out the playback APC.

At time t12 prior to performing the record operation, the target voltage is switched so that the anode voltage Vld is raised to about 9.5 V before the test emission start time t2. The maximum Vop during recording is calculated from the series resistance Rs of the semiconductor laser 1, which is estimated from the current and the temperature, for example, and the anode voltage Vld is set with a certain degree of margin. At the test emission at peak power at time t3, the anode voltage Vld is drops at time t31 if the actual voltage of the cathode voltage Vout during the test emission is a certain degree higher than 2 V. Here, it is lowered by 0.5 V. The value by which it is lowered is set to a value that is calculated such that the cathode voltage during peak power emission does not fall below 2 V. The cathode voltage Vout at time t3 is measured using the RS flip-flop based bottom detection method discussed earlier. There is no effect on the semiconductor laser drive waveform when the cathode voltage Vout is changed within a range above 2 V. Here, bottom detection refers to detection of a state in which the Vop is large and the cathode voltage Vout has fallen (called the bottom) with the peak power rather than the bottom power of the output of the semiconductor laser 1.

The anode voltage Vld is fixed at 9 V, which is set at t31, during the recording period. When playback starts after recording is over, the anode voltage Vld progressively falls from time t91. When the cathode voltage Vout is slightly over 2 V, at t92 the drop in the anode voltage Vld stops. In this case, if the internal reference voltage Vcomp is set to 2.2 V in the output voltage detection portion 7, assuming a 0.2 V voltage control step, then the anode voltage Vld can be successively lowered at the point that Vlow becomes H, and it is not necessary to return the operation of lowering the Vld by one step. The anode voltage Vld is returned to 5 V in advance prior to time t10 at which emission is stopped. By doing this, the cathode voltage Vout is kept from rising when emission is stopped. If voltage detection is periodically performed during the playback period and the cathode voltage Vout is found to rise and fall, then control is performed so that Vout is always at least a voltage of 2 V. A voltage of 0 V is output from the variable voltage source 2 at time t101, and thus, from t101 onward the cathode voltage Vout and the anode voltage Vld of the semiconductor laser 1 both become 0 V.

It should be noted that the minimum cathode voltage Vout for guaranteeing operation of the semiconductor laser drive portion 3 has been set to 2 V, but rather than this value causing sudden non-operation the instant that it falls below 2 V, instead it leads to the occurrence of a condition such as the linear properties of the current becoming slowly worse, or the pulse characteristics slowly worsening, as the cathode voltage Vout falls. In practice, it is preferable to use a semiconductor laser drive portion 3 that performs the desired operation at least to a certain degree until about 1.5 V, for example. Further, the emission power of the semiconductor laser 1 during test emission is set to a value that is different from the actual value during recording, but if the setting value is fed back so that when test emission occurs in the next recording block, the value of the recording power that is adopted for the previous recording is again adopted, then it is possible to bring the value of the peak power during test emission and the value of the peak power during recording toward the same value. Consequently, it is also possible to set the value of the peak power with the relatively slow control of sequentially changing the anode voltage Vld in recording block units. Further, since there is always a period during recording in which light is emitted at the peak power, by dividing the recording block into a plurality of periods and in each period measuring the bottom value of the cathode voltage Vout using the bottom detection function, and changing to a cathode voltage Vout that corresponds to the bottom value that is detected in the recording block, it is also possible to relatively quickly control the voltage value of the cathode voltage Vout. In a case where the lower limit of the cathode voltage Vout depends on the temperature, the temperature of the semiconductor laser driving circuit portion can be estimated with the value that is detected by the temperature sensor 9, and thus this can be used to determine the anode voltage Vld. Further, during test emission, by measuring the difference between the cathode voltage Vout that corresponds to the bias power and the cathode voltage Vout that corresponds to the peak power, it is possible to measure the series resistance Rs of the semiconductor laser 1, which determines the voltage drop due to Vop, and it is also possible to calculate the voltage drop of the cathode voltage Vout during recording using the value of the series resistance Rs that has been measured and the current value of the forward current Iop during recording.

In the above implementation of the invention, the operation was described using a blue semiconductor laser as an example, but of course the invention can be adopted for infrared semiconductor lasers for CDs, red semiconductor lasers for DVDs, and also ultraviolet semiconductor lasers for super high density optical discs of the future. With the cathode drive-type semiconductor laser driving circuit illustrated here, not every terminal of the semiconductor laser is grounded to GND, but in optical disc devices that achieve faster transfer rates and higher speeds, it is believed that a configuration in which none of the terminals of the semiconductor laser are grounded will become essential in the future, and thus the practical effect of the control for reduced power according to the invention is large. In particular, the Vop will become even larger in future ultraviolet semiconductor lasers, and thus it is conceivable that the low power configuration of this invention will take on even greater significance. Of course, in terms of structure, a method in which the anode of the semiconductor laser is grounded and the control circuit is operated by a negative power source, and current is drawn from the cathode of the semiconductor laser and the amount of current that flows to the cathode is controlled, also in conceivable, but the use of a negative power source and the fact that a level shift from the control circuit is required makes the circuit complicated, and thus it is thinkable that the configuration of the invention is more preferable as an inexpensive semiconductor laser circuit for consumer use.

The above description pertains to a configuration in which the output of the voltage source and the output of the semiconductor laser driving circuit are connected to the anode and the cathode, respectively, of the semiconductor laser 1, but it goes without saying that the effects of the invention are attained also in a case where, for a reason such as improving the response of the modulated waveform of the semiconductor laser, for example, an inductor and resistors, for example, are inserted in series into the semiconductor laser, and there is substantially no difference from the present invention.

The specific configuration of the invention is not limited to the foregoing embodiment, and various modifications and alterations within a scope that does not depart from the gist of the invention are possible.

Others

It should be noted that in the semiconductor laser driving circuit, and the optical disc device provided with that semiconductor laser driving circuit, of the invention, it is also possible for each block to be individually incorporated as a single chip by a semiconductor device such as an LSI, or incorporated into a single chip that includes some or all of the blocks. It is also possible for the semiconductor laser to be integrated as well and incorporated into a single chip.

It should be noted that here this is an LSI, but it may also be referred to as an IC, system LSI, super LSI, or ultra LSI, depending on differences in the degree of integration.

Further, the manner in which the integrated circuit is achieved is not limited to an LSI, and it is also possible to use a dedicated circuit or a general purpose processor. After LSI manufacturing, it is also possible to employ a programmable FPGA (Field Programmable Gate Array) or a reconfigurable processor in which the connections and settings of the circuit cells within the LSI can be reconfigured.

Further, if other technologies that improve upon or are derived from semiconductor technologies introduce integration technology that supplants LSIs, then naturally it is also possible to integrate the functional blocks using that technology. Biotechnology applications are one such foreseeable example.

INDUSTRIAL APPLICABILITY

The semiconductor laser driving circuit according to the invention is favorable for reducing the power consumption of the drive portion of recording and reproduction type optical disc devices, particularly those that use a blue semiconductor laser, in order to inhibit a rise in temperature of the optical head or the optical disc device overall. Additionally, the semiconductor laser driving circuit can be used for any type of optical disc device, regardless of whether the optical disc device is for playback only or uses semiconductor lasers with different wavelengths. The control for reduced power by the semiconductor laser circuit of the invention is extremely practical, as it can be inexpensively and readily obtained simply by adding a tiny circuit to an existing semiconductor laser driving circuit, and thus the invention can be adopted in various applications without any particular limitations, as long as the device uses a semiconductor laser, such as devices for optical communication or optical processing.

The invention claimed is:

1. A semiconductor laser driving circuit, comprising:
a voltage source that supplies an anode voltage to an anode of a semiconductor laser;
a drive portion that is connected to a cathode of the semiconductor laser and that changes an amount of current that is drawn in from the semiconductor laser in accordance with an emission strength of the semiconductor laser, so as to control, via feedback, an optical output of the semiconductor laser;
a measurement portion that is connected to the cathode of the semiconductor laser and that measures a cathode voltage of the semiconductor laser; and
a voltage control portion that is connected to the voltage source, and that, when the drive portion changes the amount of current that is drawn in from the semiconductor laser in accordance with the emission strength of the semiconductor laser, controls the anode voltage supplied by the voltage source such that the cathode voltage of the semiconductor laser is at least a first level, which is a voltage level of at least a minimum voltage at which an operation of the drive portion is guaranteed,
wherein the anode voltage is equal to or greater than a withstand voltage of the drive portion and a withstand voltage of the measurement portion, when the drive portion controls, via feedback, the optical output of the semiconductor laser,
wherein, during a predetermined period in which the semiconductor laser emits light at a peak power, the measurement portion measures a bottom value of the cathode voltage of the semiconductor laser, and
wherein the voltage control portion sets the bottom value of the cathode voltage of the semiconductor laser measured by the measurement portion as the first level, and controls the anode voltage supplied by the voltage source.

2. The semiconductor laser driving circuit according to claim 1, wherein the measurement portion comprises a comparison portion for comparing the measured cathode voltage of the semiconductor laser or a voltage value obtained by voltage dividing the measured cathode voltage, and a third reference voltage.

3. The semiconductor laser driving circuit according to claim 2, wherein the measurement portion further comprises a memory portion that stores a result of a comparison of a bottom value of the cathode voltage at a pulse emission of the semiconductor laser, which is obtained by the comparison portion.

4. The semiconductor laser driving circuit according to claim 1, wherein at least a portion of the voltage source, the drive portion, the measurement portion, and the voltage control portion are provided as an integrated circuit.

5. An optical disc device comprising a semiconductor laser driving circuit for recording and reproducing information of an optical disc, the semiconductor laser driving circuit comprising:

a voltage source that supplies an anode voltage to an anode of a semiconductor laser;

a drive portion that is connected to a cathode of the semiconductor laser, that draws in a current from the semiconductor laser, and that changes an amount of the current in accordance with an emission strength of the semiconductor laser, so as to control, via feedback, an optical output of the semiconductor laser;

a measurement portion that measures a cathode voltage of the semiconductor laser; and a voltage control portion that is connected to the voltage source, and that, when the drive portion changes the amount of current that is drawn in accordance with the emission strength of the semiconductor laser, controls the anode voltage supplied by the voltage source such that the cathode voltage of the semiconductor laser is at least a first level, which is a voltage level of at least a minimum voltage at which an operation of the drive portion is guaranteed, wherein the anode voltage is equal to or greater than a withstand voltage of the drive portion and a withstand voltage of the measurement portion, when the drive portion controls, via feedback, the optical output of the semiconductor laser, wherein, during a predetermined period in which the semiconductor laser emits light at a peak power, the measurement portion measures a bottom value of the cathode voltage of the semiconductor laser, and wherein the voltage control portion sets the bottom value of the cathode voltage of the semiconductor laser measured by the measurement portion as the first level, and controls the anode voltage supplied by the voltage source.

6. The optical disc device according to claim 5, wherein the voltage control portion sets the anode voltage supplied by the voltage source to a voltage level that is smaller than a second level, when reproduction of optical disc information is stopped.

7. The optical disc device according to claim 5, wherein the voltage control portion raises the anode voltage supplied by the voltage source to a voltage level that is higher than a third level in advance before moving from a reproduction operation to a record operation, and lowers the anode voltage supplied by the voltage source to the third level after the record operation is finished and the recording operation moves to the reproduction operation.

8. The optical disc device according to claim 5, wherein the measurement portion further comprises a comparison portion for comparing the measured cathode voltage of the semiconductor laser or a voltage value obtained by voltage dividing the measured cathode voltage, and a fourth reference voltage, wherein the measurement portion further comprises a memory portion that stores a result of a comparison of a bottom value of the cathode voltage at a pulse emission of the semiconductor laser, which is obtained by the comparison portion, and wherein the measurement portion selectively measures the cathode voltage corresponding to a peak power of the semiconductor laser during a record operation.

9. An integrated circuit for driving a semiconductor laser, comprising:

a voltage source that supplies an anode voltage to an anode of the semiconductor laser;

a drive portion that is connected to a cathode of the semiconductor laser and that changes an amount of current that is drawn in from the semiconductor laser in accordance with an emission strength of the semiconductor laser, so as to control, via feedback, an optical output of the semiconductor laser;

a measurement portion that is connected to the cathode of the semiconductor laser and that measures a cathode voltage of the semiconductor laser; and a voltage control portion that is connected to the voltage source, and that, when the drive portion changes the amount of current that is drawn in from the semiconductor laser in accordance with the emission strength of the semiconductor laser, controls the anode voltage supplied by the voltage source such that the cathode voltage of the semiconductor laser is at least a first level, which is a voltage level of at least a minimum voltage at which an operation of the drive portion is guaranteed, wherein the anode voltage is equal to or greater than a withstand voltage of the drive portion and a withstand voltage of the measurement portion, when the drive portion controls, via feedback, the optical output of the semiconductor laser, wherein, during a predetermined period in which the semiconductor laser emits light at a peak power, the measurement portion measures a bottom value of the cathode voltage of the semiconductor laser, and wherein the voltage control portion sets the bottom value of the cathode voltage of the semiconductor laser measured by the measurement portion as the first level, and controls the anode voltage supplied by the voltage source.

10. An integrated circuit for driving a semiconductor laser, comprising:

a drive portion that is connected to a cathode of the semiconductor laser and that changes an amount of current that is drawn in from the semiconductor laser in accordance with an emission strength of the semiconductor laser, so as to control, via feedback, an optical output of the semiconductor laser;

a measurement portion that is connected to the cathode of the semiconductor laser and that measures a cathode voltage of the semiconductor laser; and a voltage control portion that, when the drive portion changes the amount of current that is drawn in from the semiconductor laser in accordance with the emission strength of the semiconductor laser, controls an anode voltage of the semiconductor laser such that the cathode voltage of the semiconductor laser is at least a first level, which is a voltage level of at least a minimum voltage at which an operation of the drive portion is guaranteed, wherein, during a predetermined period in which the semiconductor laser emits light at a peak power, the measurement portion measures a bottom value of the cathode voltage of the semiconductor laser, and wherein the voltage control portion sets the bottom value of the cathode voltage of the semiconductor laser measured by the measurement portion as the first level, and controls the anode voltage.

11. The semiconductor laser driving circuit according to claim 1, wherein the measurement portion, (i) during a test emission, measures a bias power voltage, which is a cathode voltage corresponding to a bias power, and a peak power voltage, which is a cathode voltage corresponding to the peak power, (ii) measures a series resistance of the semiconductor laser based on a difference between the measured bias power voltage and the measured peak power voltage, (iii) calculates a voltage drop of the cathode voltage using a value of the measured series resistance of the semiconductor laser and a current value of a forward current of the semiconductor laser, and (iv) sets the first level based on the calculated voltage drop of the cathode voltage and controls the anode voltage of the semiconductor laser.

12. The optical disc device according to claim 5, wherein the measurement portion, (i) during a test emission, measures a bias power voltage, which is a cathode voltage corresponding to a bias power, and a peak power voltage, which is a cathode voltage corresponding to a peak power, (ii) measures a series resistance of the semiconductor laser based on a difference between the measured bias power voltage and the measured peak power voltage, (iii) calculates a voltage drop of the cathode voltage using a value of the measured series resistance of the semiconductor laser and a current value of a forward current of the semiconductor laser, and (iv) sets the first level based on the calculated voltage drop of the cathode voltage and controls the anode voltage of the semiconductor laser.

* * * * *